(12) United States Patent
Li et al.

(10) Patent No.: US 11,545,450 B2
(45) Date of Patent: Jan. 3, 2023

(54) INTERLOCKED REDISTRIBUTION LAYER INTERFACE FOR FLIP-CHIP INTEGRATED CIRCUITS

(71) Applicant: Nvidia Corporation, Santa Clara, CA (US)

(72) Inventors: Yuanjing Jane Li, Santa Clara, CA (US); Chuan Zhang, Santa Clara, CA (US); Jonathon Elliott, Santa Clara, CA (US); Howard Marks, Santa Clara, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 51 days.

(21) Appl. No.: 16/931,018

(22) Filed: Jul. 16, 2020

(65) Prior Publication Data

US 2022/0020709 A1    Jan. 20, 2022

(51) Int. Cl.
H01L 23/00         (2006.01)

(52) U.S. Cl.
CPC .............. *H01L 24/02* (2013.01); *H01L 24/03* (2013.01); *H01L 24/05* (2013.01); *H01L 24/11* (2013.01); *H01L 24/13* (2013.01); *H01L 2224/0219* (2013.01); *H01L 2224/0239* (2013.01); *H01L 2224/02181* (2013.01); *H01L 2224/02313* (2013.01); *H01L 2224/02351* (2013.01); *H01L 2224/03614* (2013.01); *H01L 2224/0401* (2013.01); *H01L 2224/05008* (2013.01); *H01L 2224/05017* (2013.01); *H01L 2224/05082* (2013.01); *H01L 2224/05166* (2013.01); *H01L 2224/05181* (2013.01); *H01L 2224/05184* (2013.01); *H01L 2224/11462* (2013.01); *H01L 2224/13026* (2013.01); *H01L 2224/13082* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13166* (2013.01); *H01L 2924/014* (2013.01); *H01L 2924/01013* (2013.01); *H01L 2924/01022* (2013.01); *H01L 2924/01029* (2013.01); *H01L 2924/01079* (2013.01); *H01L 2924/059* (2013.01); *H01L 2924/05042* (2013.01); *H01L 2924/1304* (2013.01); *H01L 2924/35121* (2013.01)

(58) Field of Classification Search
CPC ....................................................... H01L 24/02
See application file for complete search history.

(56) References Cited

U.S. PATENT DOCUMENTS

2013/0200528 A1 *   8/2013   Lin ..................... H01L 23/3157
257/774

* cited by examiner

*Primary Examiner* — William A Harriston

(57) ABSTRACT

This disclosure provides an integrated circuit device that includes a RDL that is interlocked with a bump (or "pillar"). The interlocked interface provides the contact RDL-bump interface with increased structural stability that can better withstand the thermal stresses associated with high performance devices IC devices. The interlock structure mitigates crack/delamination that occurs at the RDL-bump interface in large IC chips that are generally subjected to higher stresses during operation.

29 Claims, 6 Drawing Sheets

INTERLOCKED REDISTRIBUTION LAYER INTERFACE FOR FLIP-CHIP INTEGRATED CIRCUITS

TECHNICAL FIELD

This application is directed to an integrated circuit device that has an interlocked redistribution layer (RDL) interface that may be used in flip-chip applications.

BACKGROUND

Flip-chips are frequently used in high-density packaging for high-end IC devices. Flip-chip technology greatly shortens the length of the signal interconnection, reduces the delay, and effectively improves the performance, which is important for high-speed design, and because of the use of planar array connection, flip-chip interconnections can also provide higher I/O density. Redistribution layers (RDL) are implemented in such technologies for chip pin redistribution. With RDL, chip pins can be rearranged to any reasonable position on the chip. Using RDL technology, the die pads located in the chip periphery to support traditional wire bond technology can be reassigned to the "redistribution pins" of the chip anywhere on the surface. However, crack/delamination at the RDL/bump interface is one of the failure modes leading to reliability failure of the flip-chip integrated circuit (IC) chips. One cause of this problem is thermal expansion mismatch that induces sheer stress between bump materials and the top interconnect material of the chip. Under thermal stresses in the field, the crack/delamination at the interface develops over time along the interface between the bump and the RDL on the chip, resulting in reduced remaining contact area, hence increased resistance, which can result in failure of the IC chip.

SUMMARY

One aspect of this disclosure provides an IC device, comprising a semiconductor substrate, transistors located over the semiconductor substrate, an interconnect metallization layer located over the transistors and interconnecting a portion of the transistors together. A segmented redistribution layer (RDL) is located over the interconnect layer forming RDL contact pads, wherein at least a portion of the RDL contact pads has interlock openings formed therein, and the RDL contact pads are connected to another portion of the transistors by the interconnect structures. A metal connect structure is located over each of the RDL contact pads, wherein a portion of the metal connect structure is located within each of the portion of the interlock openings of the RDL contact pads to form an interlock structure with the RDL contact pads.

Another aspect of this disclosure provides a flip-chip integrated circuit (IC) device, comprising: a semiconductor die having transistors and interconnects, and RDL contact pads located over and connected to at least a portion of the interconnects where the RDL contact pads have interlock openings formed therein that provide a three dimensional interlock interface with a conductive pillar, a portion of which is located within the openings of the RDL contact pads.

Another embodiment provides a method of fabricating an integrated circuit (IC) device, comprising: patterning a redistribution layer (RDL) located over an IC chip having transistors and interconnects that interconnect the transistors to form RDL contact pads over the IC chip, wherein at least a portion of the RDL contact pads have interlock openings therein; placing a conductive metal layer over the RDL contact pads, causing the conductive metal layer to be placed in the interlock openings of the RDL contact pads; and patterning the conductive metal layer to form a contact pillars over each of the RDL contact pads and an interlock structure between each of the RDL contact pads and the contact pillar.

BRIEF DESCRIPTION

Reference is now made to the following descriptions taken in conjunction with the accompanying drawings, in which.

DETAILED DESCRIPTION

The present disclosure provides an integrated circuit device that includes a RDL contact pad that is interlocked with a bump (or "pillar"). The interlocked interface provides the contact RDL-bump interface with increased structural stability that can better withstand the thermal stresses associated with high performance devices, such as graphics processor units (GPU) and other high performance integrated circuits. The interlock structure mitigates crack/delamination at the RDL-bump interface in large IC chips induced by the thermal stress that occurs during operation. As devices are scaled down, the size of the RDL-bump contact area shrinks accordingly, making it more susceptible to failure at the interface. Therefore, a robust interface stability that ensures device reliability under extreme thermal stress conditions in the field is highly beneficial. This disclosure provides embodiments of such a structure.

Conventionally, RDL and bumps, such as a Cu (copper)-pillars, make two dimensional (2D) contact in an area defined by a polyimide open mask. That is, contact exists only along the x and y planes, i.e., along the top of the RDL. However, in this disclosure, a three dimensional (3D) interlocked contact structure is proposed at the bonding interface between the top interconnect of the die (RDL) and the bump materials of the packaging substrate, wherein contact is made along the z plane as well, that is within the depth of the RDL. This type of 3D interlocked interface greatly strengthens the bonding between RDL and the bump, significantly reducing or preventing delamination from occurring during extreme thermal stress conditions in the field, which leads to improved chip reliability. As a result, the stability of the electrical contact of the die to the substrate is increased. Also, the interlock interface structure can be easily implemented using mainstream foundry processes with no process changes needed except for implementing modification on an existing mask to pattern the interlock structure into the RDL, which is unlikely to create negative impact to RDL level wafer probing and subsequently assembly processes. The interlocked RDL-bump interface can be applied to different bumping processes, material systems, and packaging schemes, including 3D packaging.

Figure 1:
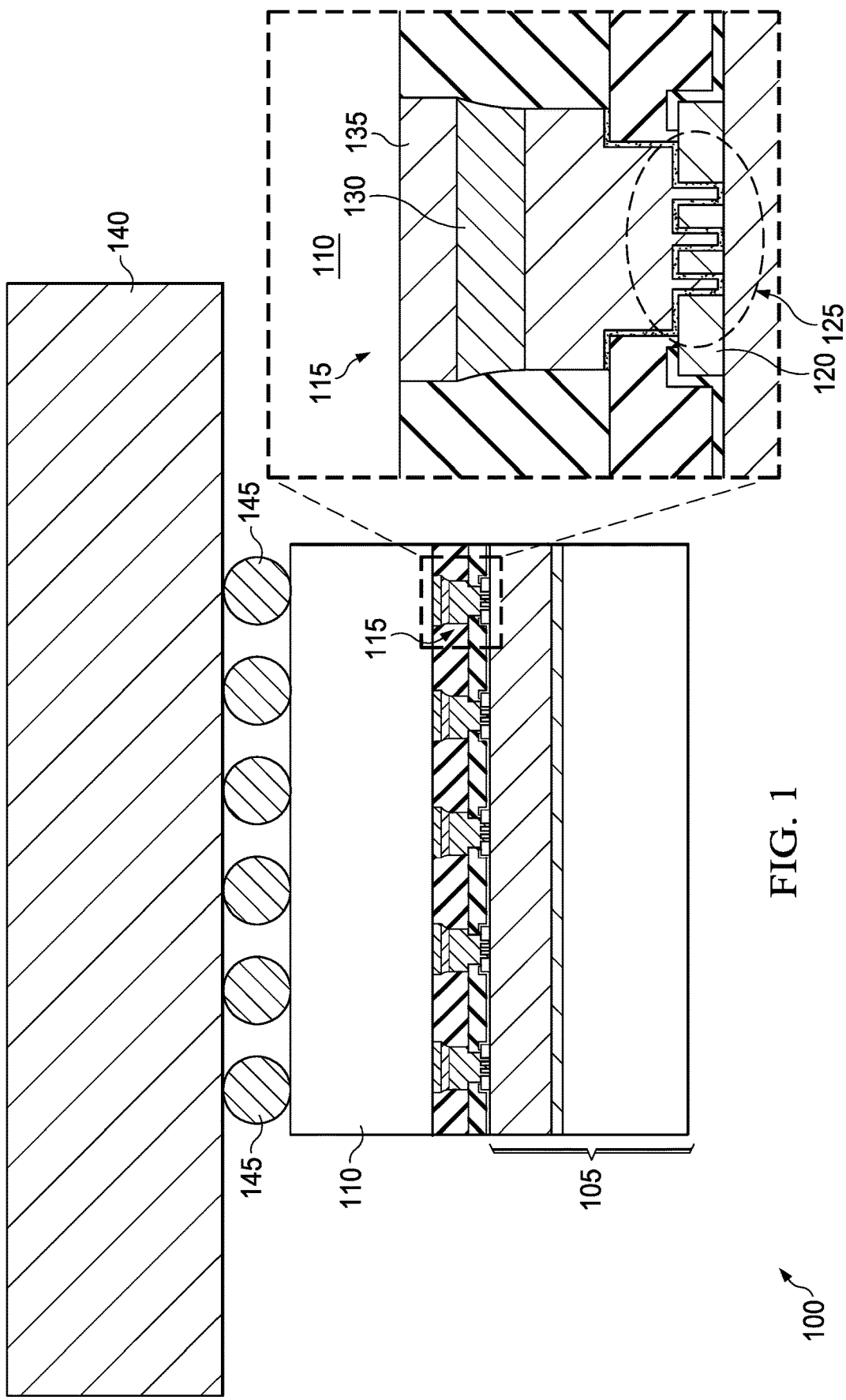
FIG. 1 illustrates a partial sectional view of a device package in which the IC device of this disclosure may be implemented.

FIG. 1 illustrates a partial sectional view of one embodiment of an integrated circuit device 100 in which the embodiments of this disclosure may be implemented. As shown, a die 105 is attached to a substrate 110, such as a printed circuit board (PCB), by contact structures 115, such as Cu pillars. As explained below, the die 105 may be any type of IC that includes a substrate, transistors, and interconnects of any known design. The respective contact structures 115 are interlocked with RDLs 120, both of which are comprised of a conductive metal. In one embodiment, depending on the conductive material used, at least a portion of the RDLs 120 have interlock openings 125 formed therein in which the metal of the contact structure 115 is deposited. As used herein, an interlock opening is one that provides an opening such that a metal connect structure is located within the RDL, as generally illustrated. However, in other embodiments, each of the RDLs 120 includes the interlock openings 125. The die 105 is electrically connected to the substrate 110 through the RDLs 120 and contact structures 115 by a solder 130 bump that connects to a contact pad 135 formed over the substrate 110. Though not shown, in this view, the substrate 110 has interconnects that run through it and form conductive paths through the substrate 110. The die 105 and the substrate 110 form an IC package that can then be electrically connected to a larger IC environment through another PCB 140 via solder bumps 145. The interlock openings 125 in the RDLs 120 provide 3D interlock structures between the RDLs and the contact structures 115 that form more robust structures that can accommodate the thermal stresses associated with high performance devices.

Figure 2:
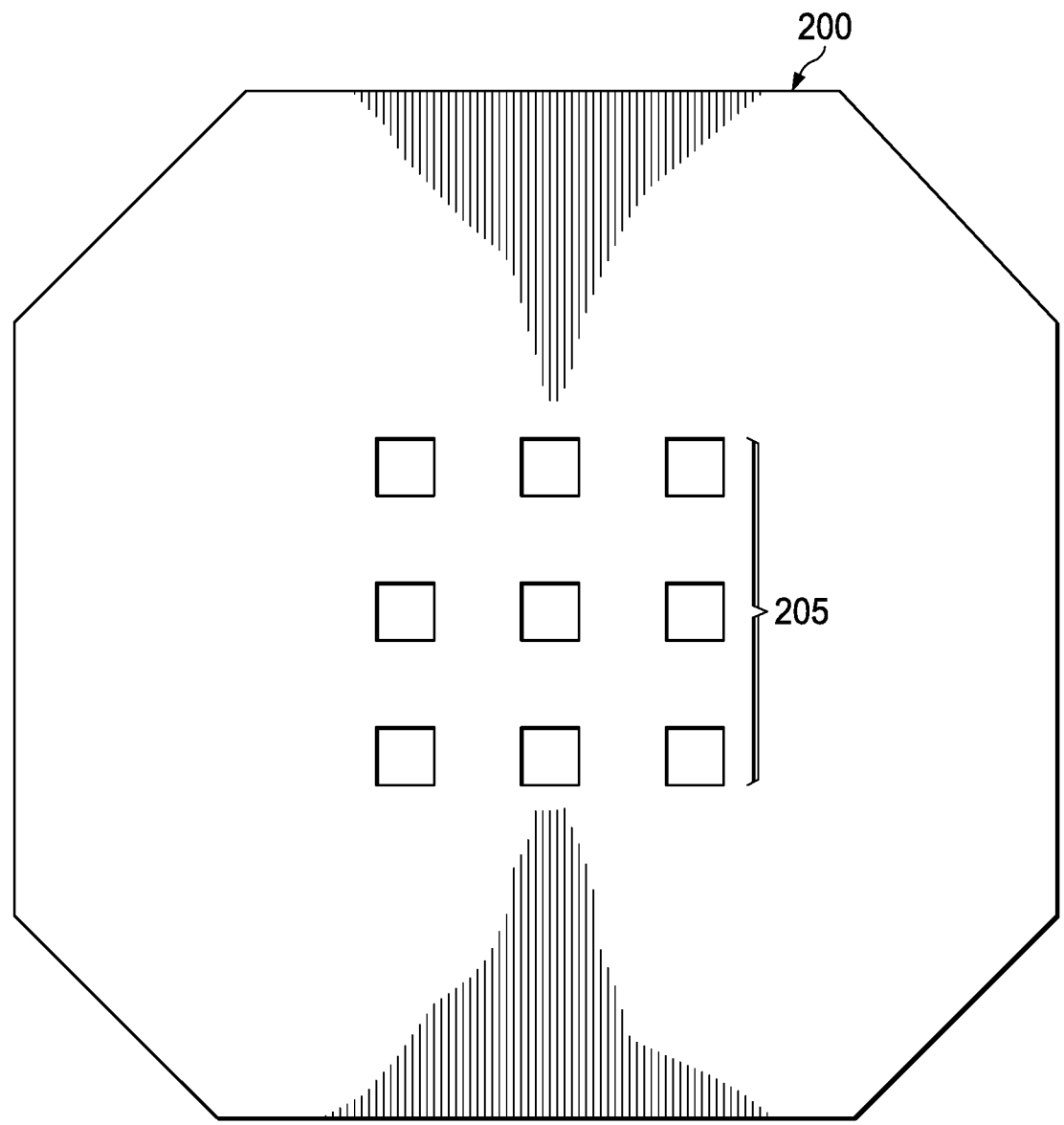
FIG. 2 is an overhead view of a mask on the RDL contact pad used to form the interlock openings.

FIG. 2 generally illustrates a RDL mask 200 with which to pattern the RDL layer that includes one or more segmented RDLs with one or more openings 205. In most embodiments, a device may contain thousands of the segmented RDLs and thousands of RDL routing traces, and the mask 200 will have the appropriate number of openings 205 for any particular design layout. As such, the number of openings 205 may vary and depend on design requirements and processing limitations, such as the aspect ratio of the openings 205. The illustrated mask 200 is for general illustration purposes only, and as noted above, other embodiments may include more or less than the illustrated openings 205. Additionally, openings 205 can be designed in various patterns, shapes, and sizes.

Figure 3:
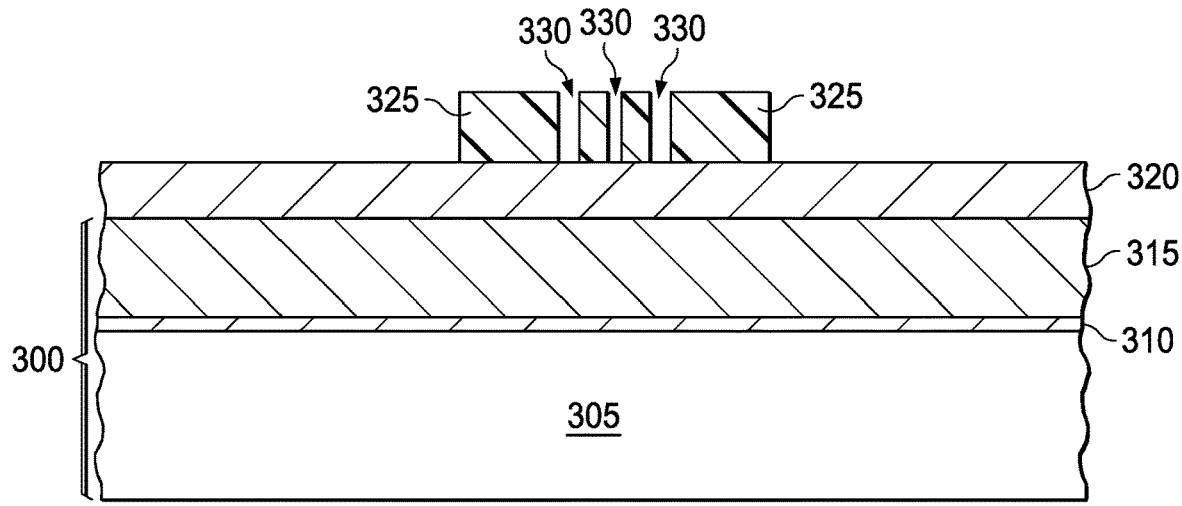
FIG. 3 is partial sectional view of a patterned photoresist for forming the interlock openings.
Figure 4:
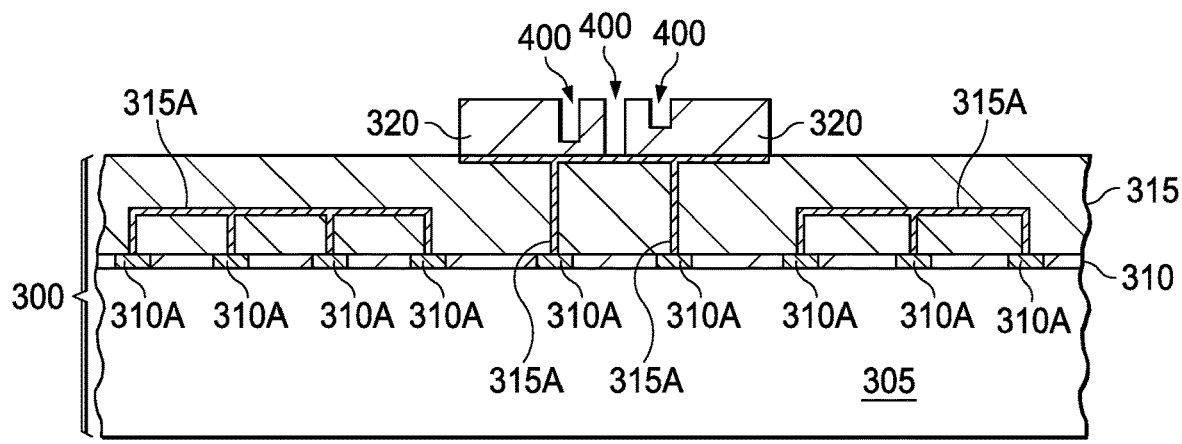
FIG. 4 is partial sectional view of an intermediate structure wherein interlock openings have been formed in a patterned RDL.

FIG. 3 illustrates a partial sectional view of a fabrication step in accordance with this disclosure. This view illustrates a partial sectional view of a die 300, as generally described above. This die 300 comprises a semiconductor substrate 305 over which a transistor layer 310 is located. As shown in FIG. 4, the transistor layer 310 includes transistors 310a, generally illustrated. The substrate 305 and transistors 310a comprise the transistor layer 310 and may be of known design and known fabrication processes may be used to fabricate the substrate 305 and the transistors 310a of the transistor layer 310. For example, the substrate 305 may be doped with known dopants to provide the degree of conductivity within the substrate and known n-type dopants and p-type dopants may be used to form the wells of the transistors 310a within the substrate 305. Transistors 310a may be formed over the surface of the substrate 305 using known deposition and lithographic processes. For purposes of this disclosure and the claims, a transistor is "over" the substrate 305, even though the wells of the transistors 310a are located within the substrate 305. An interconnect layer 315, which may include multiple interconnect layers, comprises a network of conductive traces 315a and vias that electrically connect the transistors 310a of the transistor layer 310 to a conductive RDL 320 located over the interconnect layer 315. It should be understood, however, that in some embodiments, the conductive traces 315a and vias connect some transistors 310a together internally, while others connect some other transistors to the RDL 320. Thus, not every transistor 310a is necessarily connected to the RDL 320, depending on the embodiment. Known fabrication processes and materials also may be used to fabricate the interconnect layer 315 and conductive traces 315a. The RDL 320 may also be fabricated using known deposition processes and materials. For example, the RDL 320 may be an alloy of aluminum, titanium, an Al—Cu alloy, copper, gold, or combination of these materials, or other conductive material, such as a heavily doped semiconductor material. As just mentioned, the RDL 320 is over the interconnect layer. As used herein and in the claims, a layer that is located "over" another layer is considered to be over that layer even though the overlaying layer is directly on the underlying layer, that is with no intervening layers located between the underlying layer and the overlaying layer. Moreover, thin film deposition involving chemical vapor deposition (CVD), physical vapor deposition (PVD), or electrolytic plating, sputtering deposition, evaporation, and electroless plating processes can be used to form the RDL 320. The thickness of the RDL 320 may vary, for example, its thickness may range from sub-micron values to tens of microns in value.

As seen in FIG. 3, a photoresist layer 325 has been deposited, patterned, and etched, using the mask 200 of FIG. 2, which results in openings 330 being formed in the photoresist layer 325. Prior to this step, a blanket layer of RDL metal was deposited over the surface of die 300, using known deposition processes, such as sputtering. As with other fabrication processes, known materials and etching processes may be used to pattern and etch the photoresist layer 325. For example, the photoresist layer 325 may be an organic photoresist that is applied by a spun-on process and then exposed to ultra-violet light and etched with the appropriate etchant. Known etching processes may then be used to etch the RDL, which results in the segmented/patterned RDL 320 and interlock openings 400 in the RDL 320, as shown in FIG. 4. For example, a reactive ion etch may be conducted to etch the RDL that is not covered by the patterned photoresist layer 325 to form the segmented RDL 320 and interlock openings 400. In one embodiment, the interlock openings 400 may have the same depth that extends through the thickness of the RDL 320. However, in other embodiments, the interlock openings 400 may be etched to different depths within the thickness of the RDL 320, as generally seen in the embodiment of FIG. 4, by adjusting processing parameters, such as size of the openings on the mask or etching process parameters.

Figure 5:
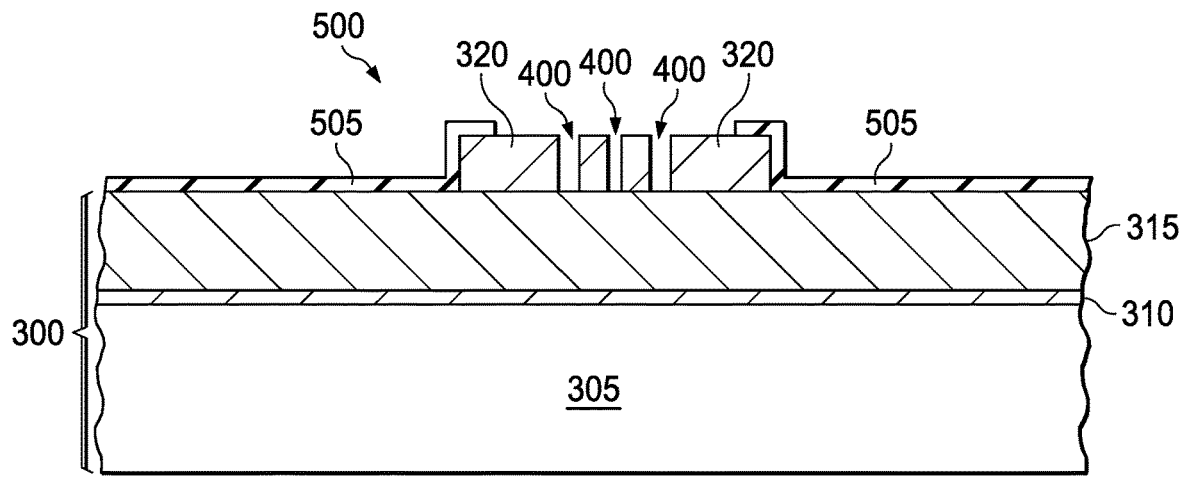
FIG. 5 is partial sectional view of an intermediate structure wherein a dielectric layer has been formed over a die and a portion of a segmented RDL, including a patterned contact pad.

After the RDL etch is complete, the remaining photoresist layer 325 is removed and a dielectric layer 505 is deposited. FIG. 5 illustrates a partial sectional view of one embodiment of an intermediate device 500 as provided by this disclosure. In this embodiment, a dielectric layer 505 has been deposited over the intermediate device 500 and patterned, after the RDL etch is complete and the remaining photoresist layer 325 has been removed. As seen, after patterning and removal of the photoresist layer 325, a portion of the dielectric layer 505 remains over the patterned RDL 320 to provide electrical isolation of the RDL 320. In this embodiment, the openings 400 are of equal depth and extend through the thickness of the RDL 320. The dielectric layer 505 acts as a passivation layer for the device 500. The dielectric layer 505 may be deposited and patterned using known fabrication processes and materials. Due to the high aspect ratio of the interlock openings 400 in the RDL, the dielectric layer 505 is not formed to any significant extent within the interlock openings 400, thereby simplifying etching and cleanup processes. The dielectric layer 505 may be a silicon nitride, silicon dioxide, silicon oxynitride, or other known passivating materials. Also, the dielectric layer 505 can be deposited by plasma-enhanced chemical vapor deposition, and may have a thickness that ranges from sub-microns in value to a few microns thick and may be optionally planarized by chemical mechanical polishing (CMP) or other known planarization processes.

Figure 6:
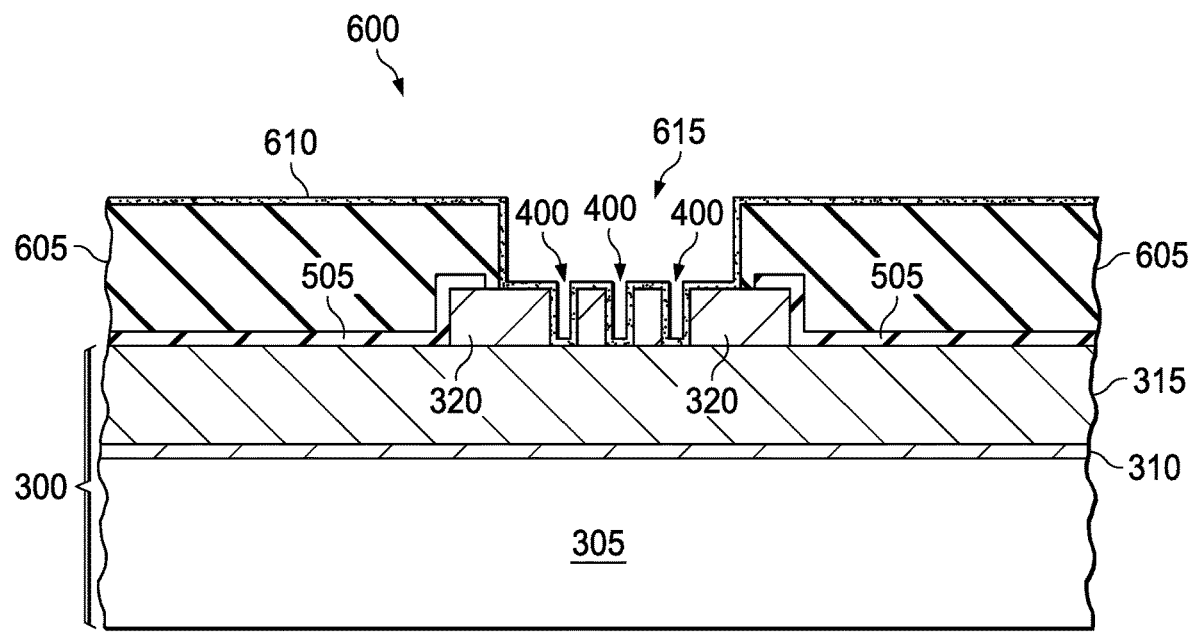
FIG. 6 is a partial sectional view of an intermediate structure wherein another dielectric layer has been formed over the dielectric layer and the segmented RDL and an under bump metallization layer has been formed in over the segmented RDL and within the interlock openings.

FIG. 6 illustrates a partial sectional view of an intermediate device 600 after the deposition and patterning of a dielectric layer 605 and the deposition of an optional under bump metallization (UBM) layer 610 over the intermediate device shown in FIG. 5. Depending on the materials used, the UBM layer 610 may also act as a barrier/adhesion layer for the device to prevent interdiffusion between the RDL 320 and the subsequently deposited contact pad metal and to provide improved adhesion between these two materials and lessen the occurrence of delamination. The thickness of the UBM layer 610 may range from a few nanometers in value to a few microns in value, and different materials with different thickness can be used for the UBM layer 610. One example of a material that can be used is a thin film of titanium, followed by a thin film of a Cu seed layer, which improves wettability during subsequent Cu electroplating process. However, other metallization materials, such as titanium nitride, gold, titanium tungsten, chromium, or a combination of these materials may be used. As with other steps discussed above, known fabrication and deposition processes and materials, other than those mentioned above, may be used at this point of the fabrication process to deposit and pattern the dielectric layer 605 and deposit the optional UBM layer 610.

The dielectric layer 605 acts as a stress relief coating and is also used as a protective layer for packaging processes. Further, the dielectric layer 605 provides protection to the finished die 300 during back grind, singulation, and assembly processing resulting in improved package yields and increased reliability lifetime performance. Known materials and deposition processes may be used to form the dielectric layer 605. For example, in one embodiment, the dielectric layer 605 is a spun-on polyimide material. In other embodiments, the dielectric layer 605 includes unmodified polyimides, as well as modified polyimides, such as polyester-imides, polyimide-imide-esters, polyimide-imides, polysiloxane-imides, and mixtures of polyimides. In some embodiments, the dielectric layer 605 is photosensitive low curing temperature dielectric resist, photosensitive composite resist, laminate compound film, solder mask resist film, liquid molding compound, $SiO_2$, $Si_3N_4$, $SiON$, $Al_2O_3$, polyimide, or other materials having similar insulating and structural properties. The dielectric layer 605 can be deposited over dielectric layer 505 and the RDL 320, such as by spun-on coating, with a polyimide precursor and curing it by heating. The thickness of the dielectric layer 605 may vary and can range from sub-micron values to tens of microns in value. A known reactive ion etch may be used to etch the dielectric layer 605. After patterning, a portion of the dielectric layer 605 extends over the edges of the RDL 320, thereby insulating the RDL 320, as generally shown in FIG. 6. The patterning also forms an opening 615 and exposes the interlock openings 400 of the RDL 320 in which the UBM layer 610 may be deposited, if desired.

Figure 7:
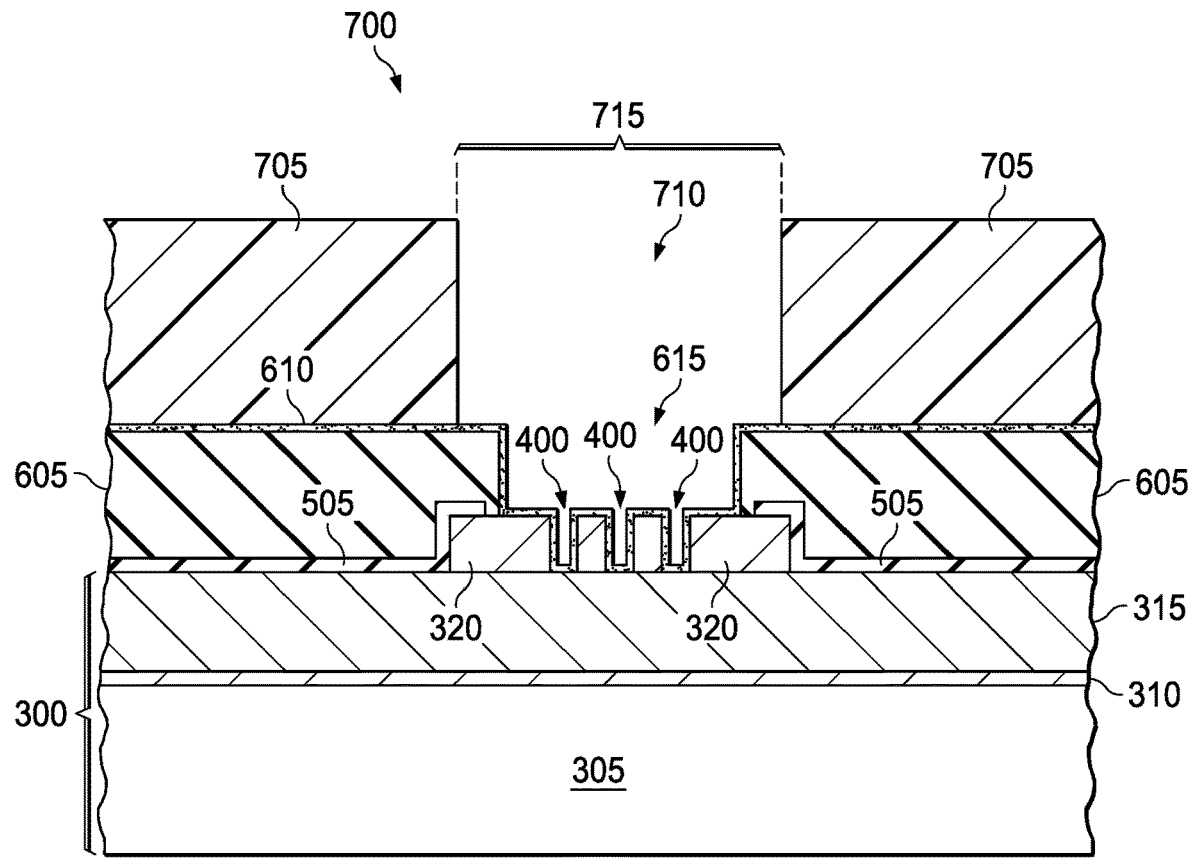
FIG. 7 is a partial sectional view of an intermediate structure wherein a photoresist layer has been deposited and patterned to form a window for the deposition of a metal connect structure.

FIG. 7 illustrates a partial sectional view of an intermediate device 700 after the application of a spin-on photoresist layer 705, photolithography, and subsequent etch, such as an reactive ion etch, conducted on the photoresist layer 705 to form an opening 710 of a pad region 715 in the intermediate device 600 of FIG. 6. The opening 710 provides a window in which a conductive metal is subsequently deposited for the formation of a conductive bump, such as a Cu pillar, of the device 700. Known processes and materials may be used to conduct this step of the fabrication process, other than those just mentioned.

Figure 8:
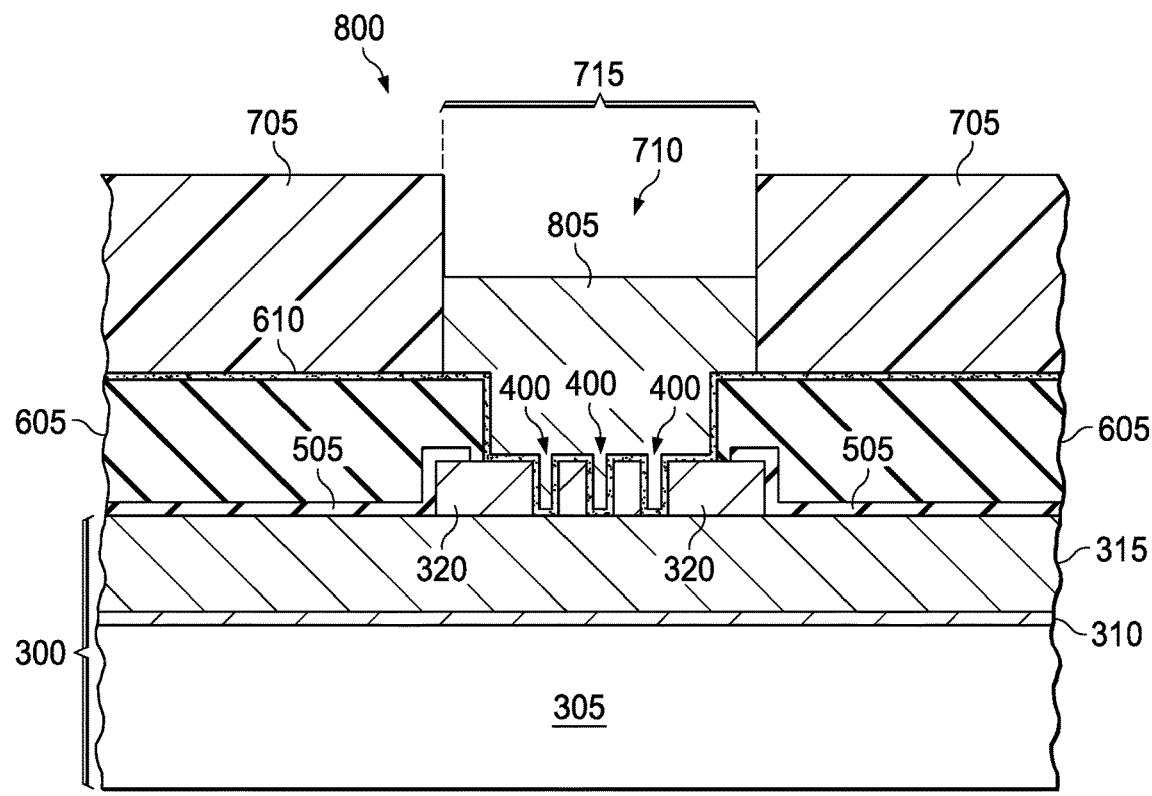
FIG. 8 is a partial sectional view of an intermediate structure wherein a metal connect structure has been deposited in the window of FIG. 7.

FIG. 8 illustrates a partial sectional view of an intermediate device 800 after the formation of a metal connect structure 805. In one embodiment, the metal connect structure 805 comprises Cu and is formed using an electroplating process. However, other known conductive materials and fabrication processes may be used to form the metal connect structure 805. As seen in FIG. 8, the contact pad 805 is formed within the opening 710 of the photoresist layer 705 and the interlock openings 400 of the RDL 320, which provides the 3D interlocking interface between the contact pad 805 and the RDL 320. The thickness of the contact pad 805 may vary, for example the thickness may range from tens of microns in value to hundreds of microns in value. The metal connect structure 805 overlaps the optional UBM layer 610 and the edges of the dielectric layer 605, which ensures good electrical contact between the UBM layer 610 and the metal connect structure 805.

Figure 9:
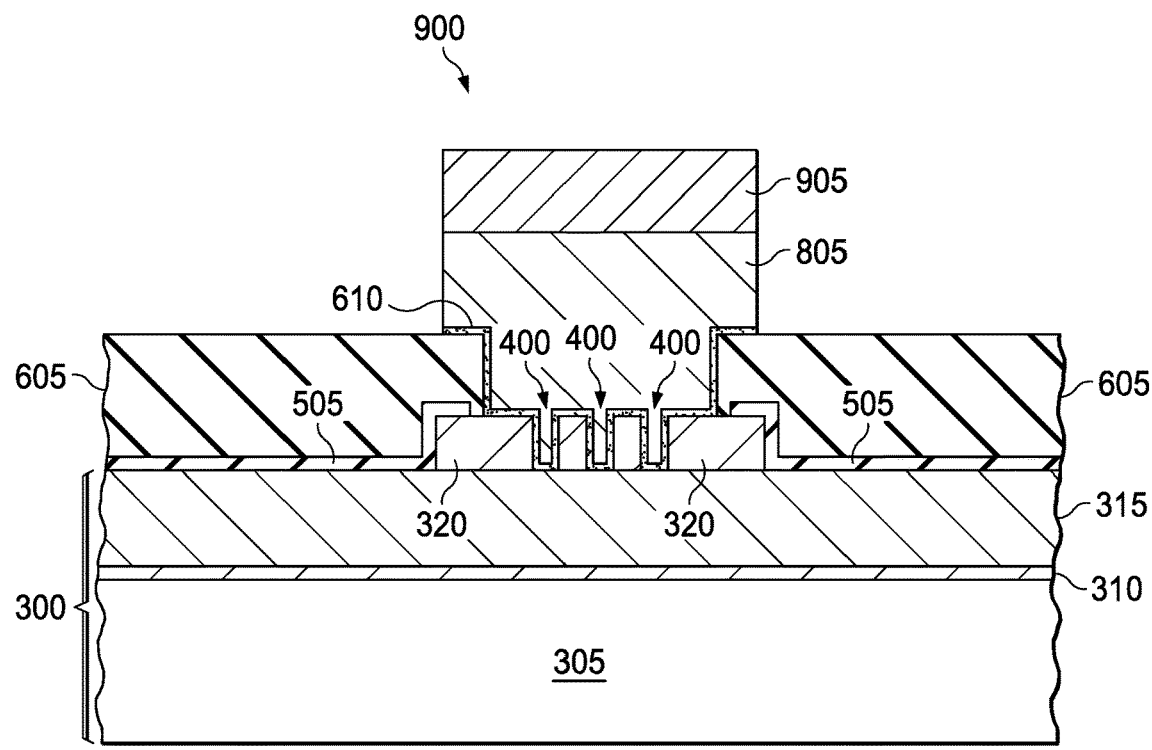
FIG. 9 is a partial sectional view of an intermediate structure wherein the photoresist of FIG. 8 has been removed after solder is applied to the metal connect structure.

FIG. 9 illustrates a partial sectional view of one embodiment of a completed flip-chip IC device 900, after the formation of a solder 905 over the metal connect structure 805 and removal of the photoresist 705 and removal etch of the UBM layer 610 from the dielectric layer 605. In one embodiment, the solder 905 is electroplated onto the metal connect structure 805 and comprises a silver/tin alloy. However, other known fabrication processes and materials may be used to form the solder 905 over the metal connect structure.

Figure 10:
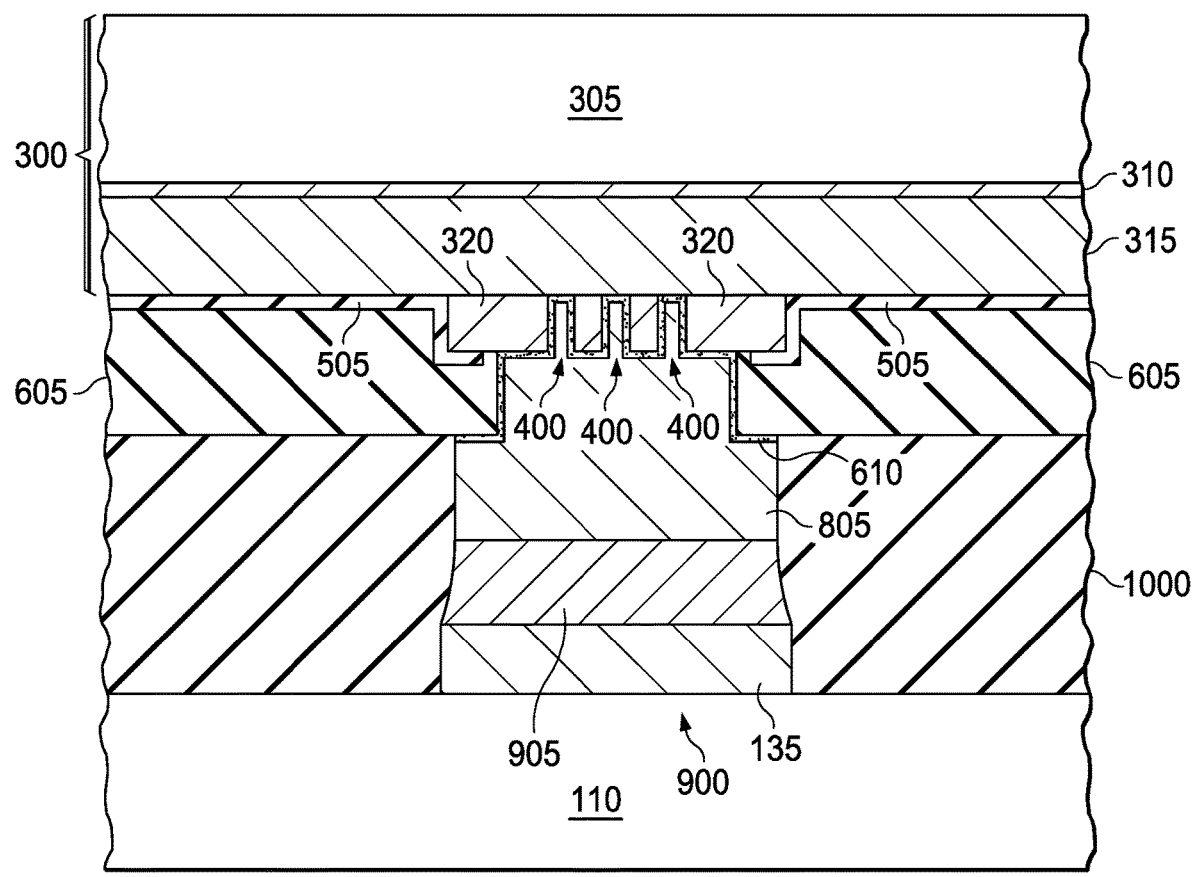
FIG. 10 is a partial sectional view of a flip-chip device bonded to a substrate.

FIG. 10 illustrates a partial sectional view of the flip-chip device 900 bonded to a substrate, such as the PCB 10, as previously discussed. In one embodiment of fabrication, the flip-chip device 900 is placed over the substrate 110 with the metal pillar 805 and solder bump 905 aligned with metal pad 135 over the substrate 110. A known solder reflow can then be performed to form solder joints (905/135) between the flip-chip device 900 and the substrate 110, after which a known underfill material 1000 may be dispensed to fill the gap and cured.

The disclosure is described above with reference to drawings. These drawings illustrate certain details of specific embodiments that implement the systems and methods of the present disclosure. However, describing the disclosure with drawings should not be construed as imposing on the disclosure any limitations that are present in the drawings. The embodiments of the present disclosure can be implemented using various types of dies. Further, although steps are described in an order, it is understood that the order of these steps can differ from what is depicted and that intermediate steps may have occurred to arrive at the depicted structure. Also, two or more steps can be performed concurrently or with partial concurrence and that all such variations are within the scope of the disclosure. Moreover, although shown in the drawings with certain components directly coupled to each other, direct coupling is not shown in a limiting fashion and is exemplarily shown. Alternative embodiments include circuits with indirect coupling between the components shown.

Terms such as "first" and "second" in connection with devices are used for purposes of identifying or differentiating one from another or from others. These terms are not intended to relate entities or operations (e.g., a first region and a second region) temporally or according to a sequence, although in some cases, these entities can include such a relationship. Nor do these terms limit the number of possible entities or operations.

Those skilled in the art to which this application relates will appreciate that other and further additions, deletions, substitutions, and modifications may be made to the described embodiments.

What is claimed is:

1. An integrated circuit (IC) device, comprising:
   a semiconductor substrate;
   transistors located over the semiconductor substrate;
   interconnect structures located within an interconnect layer located over the transistors and interconnecting a portion of the transistors together;
   a segmented redistribution layer (RDL) located over the interconnect layer forming RDL contact pads, wherein at least a portion of the RDL contact pads has interlock openings formed therein, the RDL contact pads connected to another portion of the transistors by the interconnector structures; and
   a metal connect structure located over each of the RDL contact pads, wherein a portion of the metal connect structure is located within each of the interlock openings of the RDL contact pads to form an interlock structure with the RDL contact pads, wherein the metal connect structure is not an exposed ball or bump.

2. The IC device of claim 1, further comprising a barrier/adhesion layer lining each of the interconnect openings of the RDL contact pads.

3. The IC device of claim 1, wherein the barrier/adhesion layer comprises titanium, tantalum, or tungsten.

4. The IC device of claim 1, further comprising a dielectric layer located over a portion of the RDL contact pads and comprising silicon nitride or silicon oxynitride.

5. The IC device of claim 1, wherein the metal connect structure is a contact pillar comprising copper, gold, aluminum, silver, titanium, or a combination thereof.

6. The IC device of claim 1, wherein the dielectric layer located over a portion of the RDL contact pads is a first dielectric layer, and the IC device further comprises a second dielectric layer, comprising polyimide or polybenzoxazole, located over the first dielectric layer and a portion of each of the RDL contact pads and having an opening therein in which the metal connect structure is located.

7. The IC device of claim 1, wherein the interlock openings have a same depth within the RDL.

8. The IC device of claim 1, wherein at least a portion of the interlock openings have different depths within the RDL.

9. The IC device of claim 1, wherein the RDL comprises a conductive metal.

10. The IC device of claim 9, wherein the conductive metal is aluminum, titanium, an Al—Cu alloy, copper, gold, or combination of these materials.

11. A flip-chip integrated circuit (IC) device, comprising:
    a semiconductor die having transistors and interconnects; and
    RDL contact pads located over and connected to at least a portion of the interconnects, the RDL contact pads having interlock openings formed therein that provide a three-dimensional interlock interface with a conductive pillar, a portion of which is located within the interlock openings of the RDL contact pads, wherein the conductive pillar is not an exposed ball or bump.

12. The flip-chip IC device of claim 11, wherein the semiconductor die is an integrated circuit.

13. The flip-chip IC device of claim 12, wherein the integrated circuit is a graphics processor unit.

14. The flip-chip IC device of claim 11, further comprising a barrier/adhesion layer lining each of the openings of the RDL contact pads.

15. The flip-chip IC device of claim 11, wherein the interlock openings have a same depth within the RDL contact pads.

16. The flip-chip IC device of claim 11, wherein at least a portion of the interlock openings have different depths within the RDL contact pads.

17. The flip-chip IC device of claim 11, further comprising a passivation layer located over a portion of the RDL contact pads and comprising silicon nitride or silicon oxynitride.

18. The flip-chip IC device of claim 11, wherein the conductive pillar is a contact pillar comprising copper, gold, aluminum, silver, titanium, or a combination thereof.

19. The flip-chip IC device of claim 11, further comprising a stress relief layer located over a portion of each of the RDL contact pads and having an opening therein in which the conductive pillar is located.

20. The flip-chip IC device of claim 11, wherein the RDL contact pads are comprised of metal.

21. The flip-chip IC device of claim 20, wherein the metal is aluminum, titanium, an Al—Cu alloy, copper, gold, or combination of these materials.

22. A method of fabricating an integrated circuit (IC) device, comprising:
    patterning a redistribution layer (RDL) located over an IC chip having transistors and interconnects that interconnect the transistors to form RDL contact pads over the IC chip, wherein at least a portion of the RDL contact pads have interlock openings therein;
    placing a barrier/adhesion layer lining each of the interlock openings of the RDL contact pads;
    placing a conductive metal layer over the RDL contact pads, causing the conductive metal layer to be placed in the interlock openings of the RDL contact pads; and
    patterning the conductive metal layer to form a contact pillar over each of the RDL contact pads and an interlock structure between each of the RDL contact pads and the contact pillar, wherein the contact pillar is not an exposed ball or bump.

23. The method of claim 22, further comprising:

forming a first dielectric layer over the RDL contact pads prior to placing the conductive metal layer over the RDL contact pads, and patterning the passivation layer to form an opening therein and expose the openings, and wherein a portion of the dielectric layer remains over the RDL contact pads; and forming a second dielectric layer over the first dielectric layer and the RDL contact pads and patterning the second dielectric layer to form an opening therein and expose the interlock openings in the RDL contact pads, and wherein a portion of the second dielectric layer remains over the RDL contact pads, and wherein the conductive metal layer is deposited within the opening of the first dielectric layer and the interlock openings in the RDL contact pads.

24. The method of claim 23, further comprising depositing a barrier/adhesion layer over the second dielectric layer and the RDL contact pads and within the interlock openings of the RDL contact pads.

25. The method of claim 22, wherein the interlock openings in the RDL have a same depth within the RDL contact pads.

26. The method of claim 22, wherein at least a portion of the interlock openings have different depths within the RDL contact pads.

27. The method of claim 22, further comprising placing solder over each of the contact pillars.

28. The method of claim 22, wherein the IC chip is a graphics processor unit.

29. The method of claim 28 further comprising placing the IC device over a copper pad of a printed circuit board (PCB), such that the solder of the contact pillars contacts the copper pad of the PCB and reflowing the IC device onto the substrate.

* * * * *